(12) United States Patent
Pratt et al.

(10) Patent No.: US 10,727,880 B1
(45) Date of Patent: Jul. 28, 2020

(54) CREST FACTOR REDUCTION IN CABLE COMMUNICATION SYSTEMS

(71) Applicant: Analog Devices International Unlimited Company, Limerick (IE)

(72) Inventors: Patrick Pratt, Mallow (IE); David Jennings, Bristol (GB)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 16/295,001

(22) Filed: Mar. 7, 2019

(51) Int. Cl.
| H04B 1/04 | (2006.01) |
| H03F 1/32 | (2006.01) |
| H03F 3/24 | (2006.01) |
| H04L 27/26 | (2006.01) |
| H03F 3/193 | (2006.01) |

(52) U.S. Cl.
CPC ......... *H04B 1/0475* (2013.01); *H03F 1/3252* (2013.01); *H03F 3/193* (2013.01); *H03F 3/245* (2013.01); *H04L 27/2624* (2013.01); *H04B 2001/0425* (2013.01)

(58) Field of Classification Search
CPC ..... H03F 1/3241; H03F 2200/63; H04B 1/04; H04B 2001/0408; H04L 1/0033; H04L 25/03343; H04L 27/2623; H04L 27/2624; H04N 7/102
See application file for complete search history.

(56) References Cited

U.S. PATENT DOCUMENTS

| 6,175,551 | B1 | 1/2001 | Awater et al. |
| 7,697,591 | B2 | 4/2010 | Copeland |
| 9,014,319 | B1 * | 4/2015 | Copeland ............ H04L 27/2624 375/350 |
| 9,660,675 | B2 | 5/2017 | Pratt |
| 9,819,313 | B2 | 11/2017 | Deo |
| 1,003,341 | A1 | 7/2018 | Pratt |
| 1,006,326 | A1 | 8/2018 | Pratt |
| 1,009,723 | A1 | 10/2018 | Pratt |
| 1,022,497 | A1 | 3/2019 | Pratt |
| 1,041,165 | A1 | 9/2019 | Dick et al. |
| 10,411,656 | B1 * | 9/2019 | Dick ........................ H04B 1/04 |
| 2014/0169496 | A1 | 6/2014 | Yang et al. |
| 2017/0338841 | A1 | 11/2017 | Pratt |
| 2017/0338842 | A1 | 11/2017 | Pratt |
| 2018/0167091 | A1 | 6/2018 | Pratt et al. |

(Continued)

OTHER PUBLICATIONS

Beek, *Multi-carrier single-DAC transmitter approach applied to digital cable television*, Eindhoven University of Technology, Jan. 1, 2011, DOI: 10.6100/IR716353, 327 pages.

(Continued)

*Primary Examiner* — David S Huang
(74) *Attorney, Agent, or Firm* — Patent Capital Group

(57) ABSTRACT

Otherwise incompatible crest factor reduction (CFR) and cable tilt compensation can be used together, such as in a cable television or other cable communication system having a frequency-dependent signal loss at higher frequencies. The CFR can be used to limit or reduce peaks of signals provided to a power amplifier, while additional tilt reference and tilt equalizer circuits are included to address deleterious peak regrowth effects that may otherwise arise by using conventional CFR together with cable tilt compensation.

20 Claims, 9 Drawing Sheets

(56) References Cited

U.S. PATENT DOCUMENTS

2018/0191314 A1 7/2018 Pratt et al.
2018/0309465 A1 10/2018 Pratt

OTHER PUBLICATIONS

Pratt et al., *Ultrawideband Digital Predistortion (DPD): The Rewards (Power and Performance) and Challenges of Implementation in Cable Distribution Systems*, Analog Devices, AnalogDialogue 51-07, Jul. 2017, 7 pages.

* cited by examiner

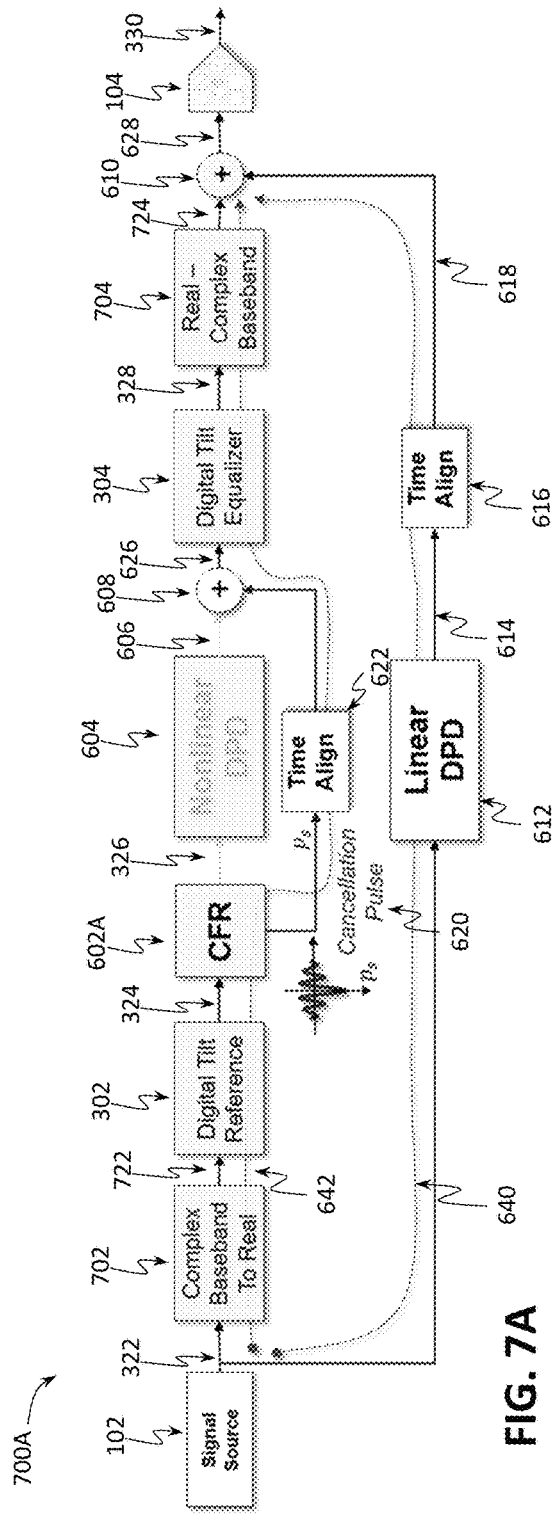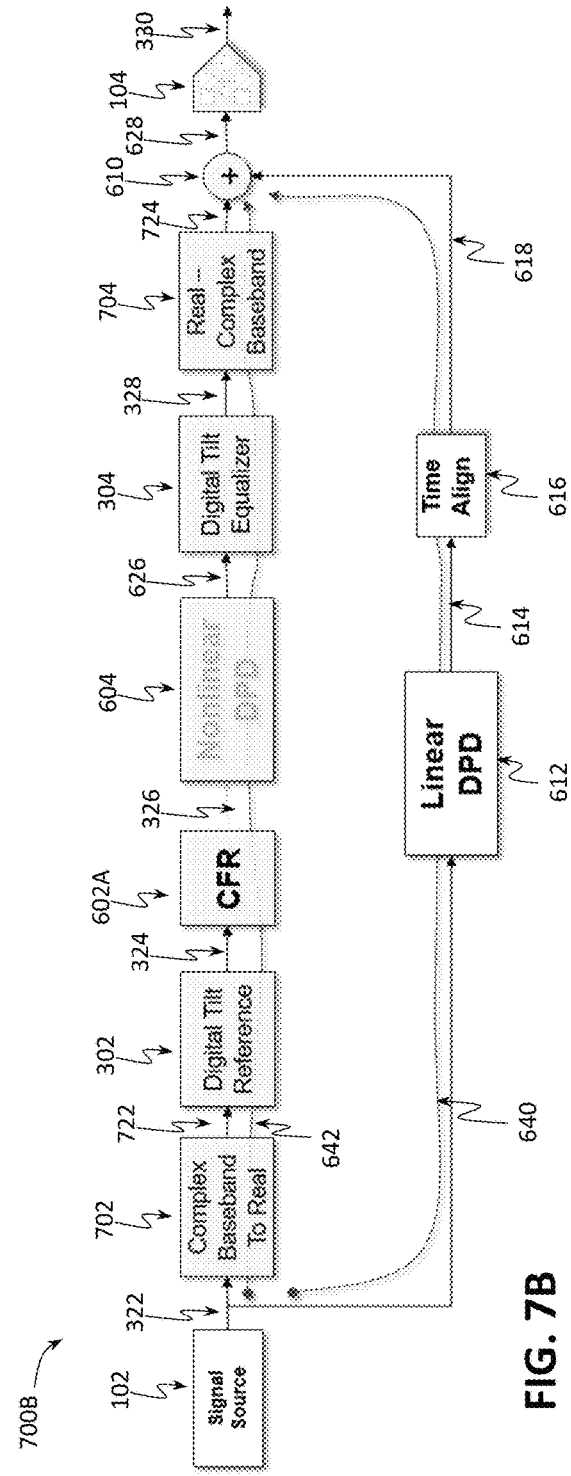
FIG. 7A
FIG. 7B

CREST FACTOR REDUCTION IN CABLE COMMUNICATION SYSTEMS

TECHNICAL FIELD OF THE DISCLOSURE

The present disclosure generally relates to cable communication systems such as cable television networks.

BACKGROUND

The first cable communication systems started to appear in the early '50s. Even with the rapid changes in technology and distribution methods, cable has maintained a prominent position as a conduit for the distribution of data, with attempts being made to layer new technologies onto existing cable networks. One example of such technologies is wireless cellular (mobile) communication, with Long Term Evolution (LTE) and $5^{th}$ generation (5G) being the latest generation technologies at the moment. Both, systems used for wireless communication such as LTE or 5G, and systems used for cable communication such as cable television networks, are radio systems in that they transmit and receive signals in the form of electromagnetic waves in the radio frequency (RF) range of approximately 3 kiloHertz (kHz) to 300 gigaHertz (GHz). In both of these types of systems a power amplifier (PA) to amplify RF signals prior to transmission is a crucial component. Therefore, it might be tempting to integrate techniques developed for dealing with a PA in wireless communication systems into cable communication systems. However, such integration is far from trivial because the cable environment is very different from the wireless environment. First of all, the cable environment can be regarded as a closed environment: what happens in the cable stays in the cable. The operator owns and controls the complete spectrum. Out-of-band (OOB) distortions are not a major concern. In-band distortions are, however, of critical importance. The service providers have to ensure the highest quality in-band transmission conduit so that they can leverage the maximum data throughputs.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 7A illustrates a cable communication system with a complex baseband to real conversion for a tilt-adjusted CFR and a dual-path DPD with a cancellation pulse, according to some embodiments of the present disclosure;

FIG. 7B illustrates a cable communication system with a complex baseband to real conversion for a tilt-adjusted CFR and a dual-path DPD without a cancellation pulse, according to some embodiments of the present disclosure;

DESCRIPTION OF EXAMPLE EMBODIMENTS OF THE DISCLOSURE

Overview

Figure 1:
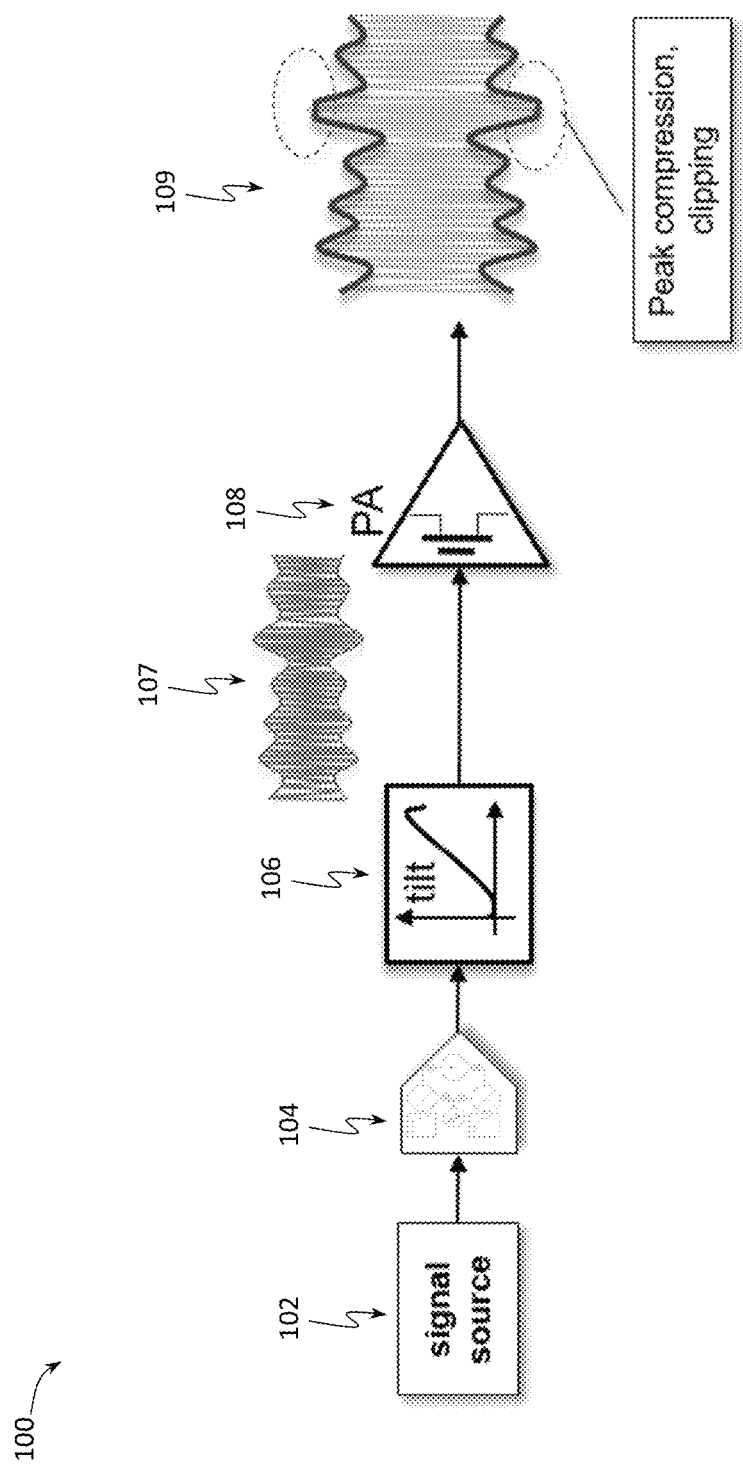
FIG. 1 illustrates peak power clipping by a PA in a cable communication system with a tilt circuit.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

For purposes of illustrating CFR in cable communication systems, proposed herein, it might be useful to first understand phenomena that may come into play in cable communication systems. The following foundational information may be viewed as a basis from which the present disclosure may be properly explained. Such information is offered for purposes of explanation only and, accordingly, should not be construed in any way to limit the broad scope of the present disclosure and its potential applications.

Cable transmit (TX) signals are typically associated with a relatively large Crest Factor (CF), also referred to as a "Peak to Average Power Ratio" (PAPR). When a PA has limited peak power capability, it may perform hard compression or clip the peaks of a TX signal, which may result in unrecoverable distortion of the signal. CFR is a technique developed for wireless communication systems to limit peak excursions in a controlled manner prior to supplying TX signals to a PA, so that the resultant distortion introduced by the PA is minimized and spectrally shaped in some prescribed fashion. Thus, CFR attempts to eliminate, or at least reduce, peak clipping and peak compression which may be imposed by the PA by reducing the peaks in TX signals prior to supplying the signals to the PA. Unfortunately, inventors of the present disclosure realized that CFR techniques developed for wireless communication systems are not directly compatible with cable communication systems due to the presence of a tilt compensation component, unique to the cable communication systems.

Transmission of a signal through a cable, e.g., in cable television communications network, presents challenges not found in wireless communication systems. One such challenge relates cable losses, i.e., attenuation applied to the signal due to transmission through a cable. Cable losses are frequency-dependent, i.e., the amount of attenuation due to transmission through a cable depends on the frequency of the signal being transmitted. In other words, a cable can present a load to a PA circuit that exhibits a frequency-dependent signal loss. In particular, transmission through a cable may be associated with little or no attenuation applied to lower-frequency signal components and much greater attenuation applied to higher-frequency system components (i.e., cable losses are smaller at the lower frequencies and larger at the higher frequencies). For example, a cable may exhibit a high frequency rolloff characteristic of about 2 decibels (dB) of signal amplitude reduction per 100 Mega-Herz (MHz) of frequency, such as at frequencies above about 50 MHz (i.e., a transfer function of a cable may be shaped as a line titled downwards).

One approach to reducing signal loss through the cable is to include a tilt compensation component that can apply an "uptilt" frequency modification to a signal that is input into the PA, so that the resulting output signal from the PA is frequency compensated at its destination after being transmitted across the cable. Thus, a tilt compensation component, also referred to as a "tilt compensation" or, simply, "tilt," is a component typically included in a TX path of cable communication systems to compensate TX signals for cable losses. Because cable losses are frequency-dependent, tilt compensation involves amplifying signal components of different frequencies by different amounts. The term "tilt" used in "tilt compensation" comes from the fact that tilt compensation may be seen as applying an inverse function of the transfer function of a cable, where little or no amplification may be applied by the tilt compensation to lower-frequency signal components and greater amplification may be applied to higher-frequency signal components (i.e., a transfer function of tilt compensation is a line tilted upwards). An example of a cable communication system with a tilt circuit is shown in FIG. 1.

FIG. 1 illustrates a cable communication system 100 that includes a signal source 102, an upconverter 104, a tilt compensation circuit 106, and a PA 108. The signal source 102 provides a lower-frequency signal to be transmitted over a cable to the upconverter 104. The upconverter 104 performs an upconversion of the lower-frequency signal to a higher-frequency signal, which is then provided to the tilt compensation circuit 106. The tilt compensation circuit 106 performs tilt compensation (uptilt) to compensate for the cable losses that the TX signal will undergo when it travels through the cable (the cable being after the PA 108, e.g., as shown with a cable 210 in FIG. 2). A schematic illustration of a signal that may be output by the tilt compensation circuit 106 is shown in FIG. 1 as a tilt circuit output signal 107. The PA 108 may then amplify the tilt circuit output signal 107 and output an amplified tilt-compensated PA output signal 109, also schematically illustrated in FIG. 1. The signal 109 illustrates that, when the peak power capability of the PA 108 is limited, the PA 108 may perform hard compression and clipping of the peaks, which may result in unrecoverable distortion.

Figure 2:
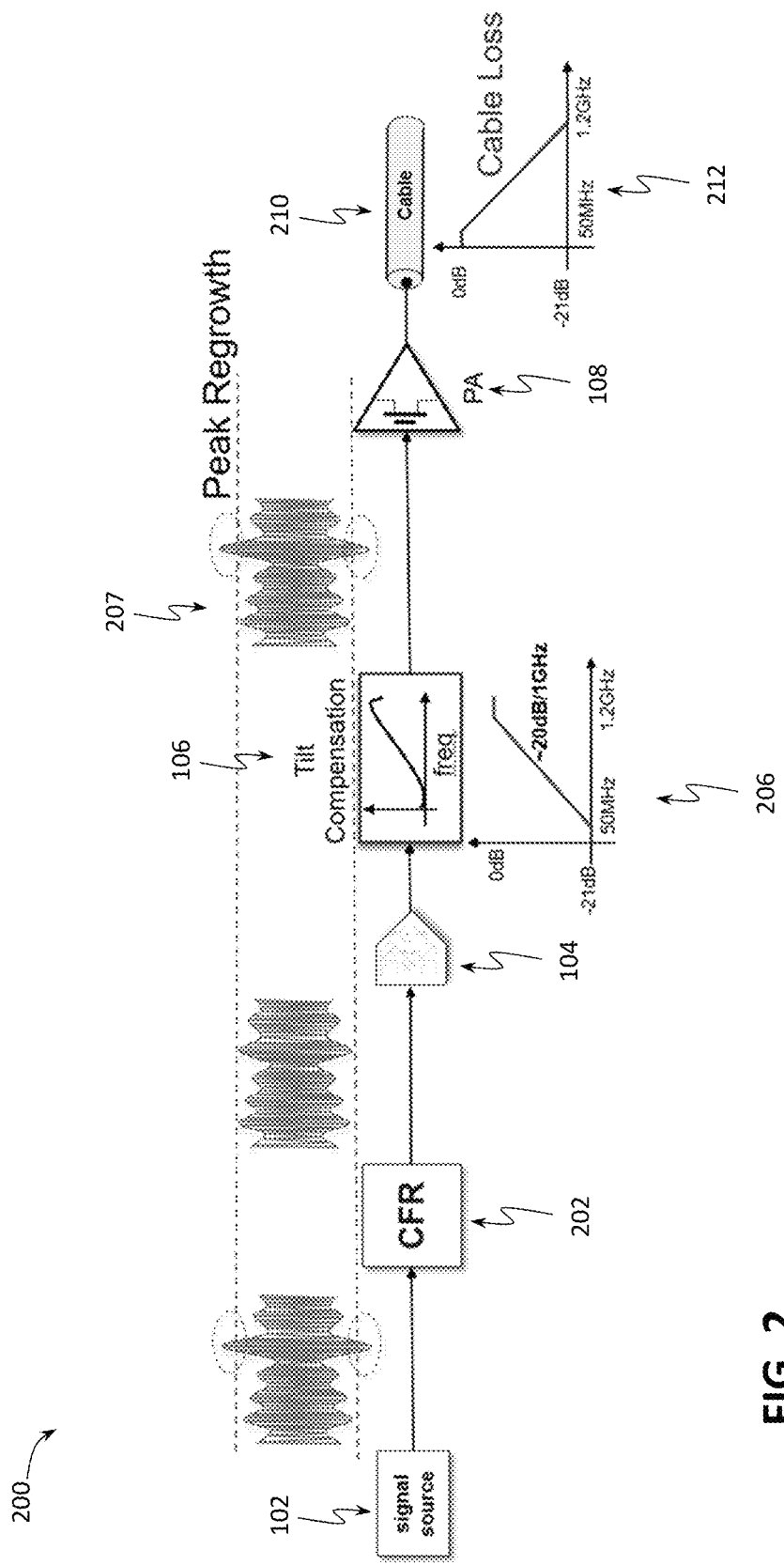
FIG. 2 illustrates peak regrowth problem if a crest factor reduction (CFR) is introduced to a cable communication system with a tilt circuit.

As described above, in the realm of wireless communication systems, CFR is a technique used to reduce or eliminate hard compression and clipping of the peaks by a PA. Having encountered hard compression and peak clipping issues with a PA in a cable system, as shown in FIG. 1, it might be tempting to simply employ CFR, as used in wireless communication systems, to mitigate these limitations of the PA and reduce PAPR of cable TX signals. However, inventors of the present disclosure realized that, while CFR may help with reducing PAPR of a cable TX signal, tilt compensation provided in the path of the cable TX signal is likely to render such reduction ineffective as it could result in peak regrowth, as illustrated in FIG. 2. FIG. 2 illustrates a cable communication system 200, which is similar to the system 100 (where the same reference numerals are used to illustrate the same or analogous elements), but now also including a CFR circuit 202, provided in the TX path before the tilt compensation circuit 106. FIG. 2 also illustrates a cable 210, coupled to the output of the PA 108, and provides schematic illustrations of a tilt compensation 206 provided by the tilt compensation circuit 106 in an attempt to compensate for the cable loss 212 which the TX signal undergoes due to transmission through the cable 210. The inventors of the present disclosure realized that, unfortunately, the tilt compensation 206 has a high-pass filter (HPF) transition slope of about 20 dB/GHz, where the band-limiting, pronounced in-band shaping effect of the tilt can undo the CFR, resulting in peak regrowth, as shown in FIG. 2 with a tilt circuit output signal 207 which is output by the tilt compensation circuit 106 even when the CFR 202 is present. In fact, the peaks produced by the peak regrowth due to the implementation of the CFR circuit 202 may even be greater than those present in the signal provided to the PA 108 in absence of the CFR circuit 202.

As the foregoing illustrates, by itself, uptilt frequency modification necessary to compensate for cable losses can be fundamentally incompatible with, and even deleterious to, CFR performed to limit the peaks presented to a PA. Embodiments of the present disclosure provide, among other things, examples of approaches for overcoming such technical challenges, such as to allow CFR to be used effectively even in presence of frequency modification, such as uptilt frequency modification, to compensate for signal loss through a cable, such as a cable of a cable television communications network. A modified approach to using a CFR in presence of a tilt circuit in a cable communication system is referred to herein as a "tilt-adjusted CFR" to highlight the fact that the approach involves using a CFR but now adjusted for the fact that there is a tilt circuit present.

Among other things, embodiments of the present disclosure explain how otherwise incompatible CFR and cable tilt compensation (uptilt) can be used together, such as in a cable television or other cable communication system having a frequency-dependent signal loss at higher frequencies. In particular, in various embodiments of the tilt-adjusted CFR as described herein, the CFR can be used to limit or reduce peaks of signals provided to a PA, while additional tilt reference and tilt equalizer are included to address deleterious peak regrowth effects that may otherwise arise by using conventional CFR together with cable tilt compensation.

As will be appreciated by one skilled in the art, aspects of the present disclosure, in particular aspects of tilt-adjusted CFR in cable communication systems as described herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more hardware processing units, e.g. one or more microprocessors, of one or more computers. In various embodiments, different steps and portions of the steps of any methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g. to the existing cable communication transmitters, receivers, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Various aspects of the illustrative embodiments are described using terms commonly employed by those skilled in the art to convey the substance of their work to others skilled in the art. The terms "substantially," "approximately," "about," etc., may be used to generally refer to being within +/−20% of a target value based on the context of a particular value as described herein or as known in the art. For the purposes of the present disclosure, the phrase "A and/or B" or notation "A/B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A, B, and/or C).

Example Cable Communication System with a Tilt-Adjusted CFR

Figure 3:
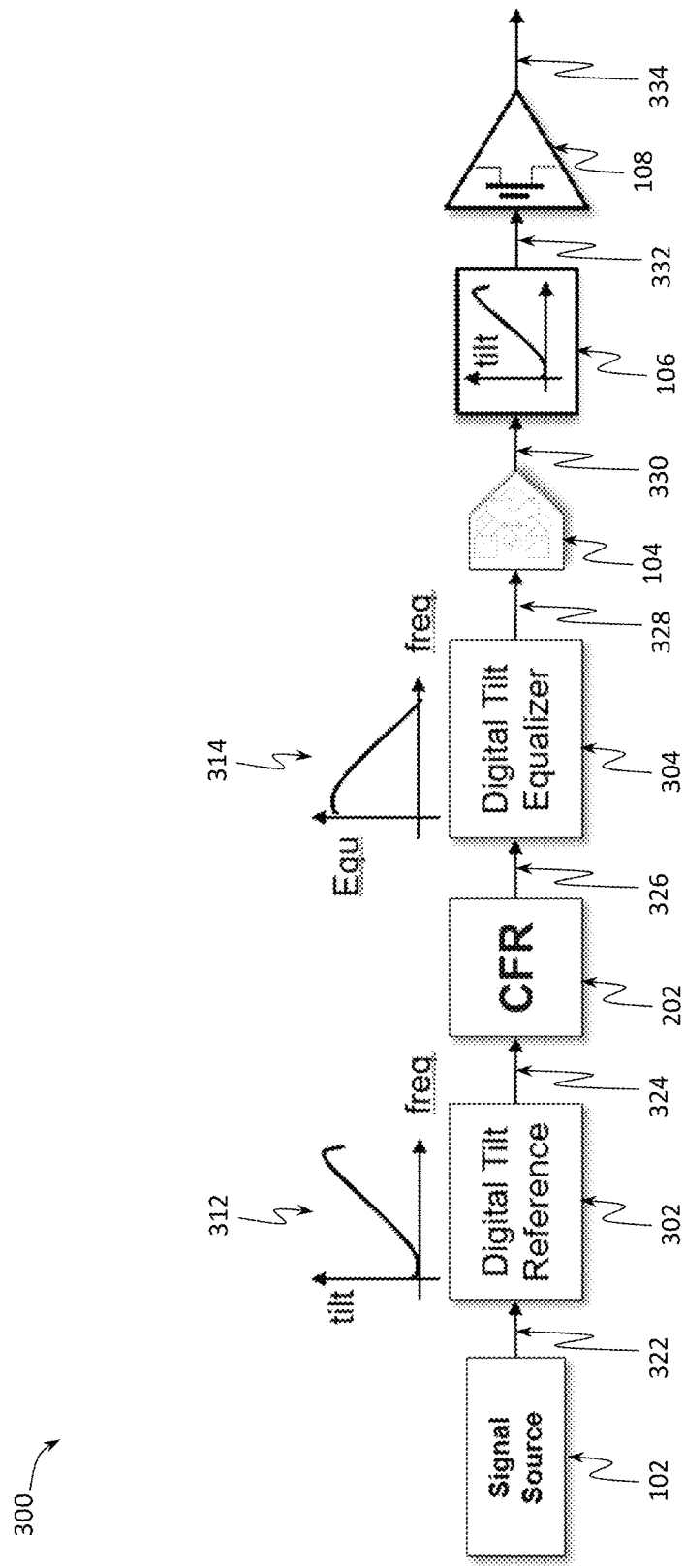
FIG. 3 illustrates a cable communication system with a tilt-adjusted CFR, according to some embodiments of the present disclosure.

FIG. 3 shows an example of a cable communication system 300 that can reduce or altogether avoid the above-described phenomenon of the tilt compensation component 106 defeating the benefit sought by including the CFR circuit 202 when these two features are used together. The system of FIG. 3 is similar to the system 200 of FIG. 2 in that it also includes the signal source 102, the upconverter circuit 104, the tilt compensation circuit 106, the PA circuit 108, and the CFR circuit 202, as described above. Although not specifically shown in FIG. 3, a cable such as the cable 210 shown in FIG. 2 may be driven by a signal output by the PA 108. The tilt compensation circuit 106 may be an analog frequency modification "uptilt" filter circuit, placed in the TX signal path, for the signal output by the signal source 102, before the PA circuit 108. The tilt compensation circuit 106 may provide pre-emphasis having a high-pass frequency gain expansion characteristic (e.g., +2 dB/100 MHz amplification for frequencies exceeding about 50 MHz) of a cable to offset or compensate for the low-pass frequency-dependent signal loss of the cable 210.

In contrast to FIG. 2, in FIG. 3, a frequency-selective tilt reference circuit 302 (which may also be referred to as a "reference uptilt") and a tilt equalizer circuit 304 has been included in the TX signal path.

As shown in FIG. 3, the tilt reference circuit 302 may be included in the signal path before the CFR circuit 202. For example, the tilt reference circuit 302 may have an input coupled to an output of the signal source 102, so that it may receive the TX signal from the signal source 102, and may have an output coupled to an input of the CFR 202, so that the output generated by the tilt reference circuit 302 may be provided to the CFR circuit 202. Similar to the tilt compensation circuit 106, the tilt reference circuit 302 can provide a high-pass frequency gain expansion characteristic (e.g., +2 dB/100 MHz amplification for frequencies exceeding about 50 MHz), such as that shown at 312, of a cable offset or compensate for the low-pass frequency-dependent signal loss of the cable 210. In some embodiments, the tilt reference circuit 302 may be a digital tilt reference circuit 302.

In various embodiments, the tilt reference circuit 302 may be at least partially pre-programmed and/or at least partially trained to generate appropriate output 324 (i.e., the pre-tilted input signal that will be further processed by the CFR circuit) by applying to the input signal a frequency response selected to emulate a frequency response of the tilt compensation circuit 106. To that end, in some embodiments, the tilt reference circuit 302 may be implemented as a digital filter that could be designed based on, e.g., lab characterization and/or factory calibration. For example, in some embodiments, pre-programming or training the tilt reference circuit 302 may include using suitable instrumentation to stimulate the tilt fixture, extract the response, and fit a model to the input-output relationship. In some embodiments, such a model may be fit online, using the actual transmitter to stimulate the tilt fixture and the DPD observation receiver to extract the response; afterwards, a fit of the model (e.g., a software fit) may be performed offline.

As also shown in FIG. 3, the tilt equalizer circuit 304 may be included in the signal path after the CFR circuit 202. For example, the tilt equalizer circuit 304 may have an input coupled to an output of the CFR circuit 202, so that it may receive the output signal generated by the CFR circuit 202, and may have an output coupled to an input of the upconverter 104, so that the output generated by the tilt equalizer circuit 304 may be provided to the upconverter 104. The tilt equalizer circuit 304 may include an equalizer having a frequency modification setting that has a low-pass filter characteristic, such as that shown at 314, such as approximately −2.2 dB/100 MHz for frequencies above about 50 MHz, which can be approximately the inverse of the frequency modification provided by the tilt reference circuit 302 and that provided by the tilt compensation circuit 106. The particular frequency modification to be provided by the equalizer circuit 304 can be selected to compensate for or eliminate the effect of the tilt compensation circuit 106 interposing a frequency-dependent uptilt gain and group delay variation between the CFR circuit 202 and the PA circuit 108. The particular frequency modification to be provided by the equalizer circuit 304 can be selected to provide a substantially constant gain vs. frequency, a substantially constant group delay vs. frequency, or both, at the output of the equalizer circuit 304. Thus, the equalizer circuit 304 can be used to obtain a substantially constant gain response and group delay, across a frequency band of interest, between the output of the CFR circuit 202 and the input of the PA circuit 108. To help preserve that the PA circuit 108 preserves the uptilt correction provided by the tilt compensation circuit 106, the signal provided to the input of the CFR circuit 202 can be shaped by a digital representation of the uptilt of the analog tilt compensation circuit 106, and such digital representation of the uptilt can be applied to the input of the CFR circuit 202 using the digital tilt reference circuit 302. In some embodiments, the tilt equalizer circuit 304 may be a digital tilt equalizer circuit 304.

In various embodiments, the tilt equalizer circuit 304 may be at least partially pre-programmed and/or at least partially trained to generate equalized output 328 (i.e., the equalized output signal, a version of which will eventually be amplified by the PA circuit 108) by applying to the input signal to the tilt equalizer circuit 304 a frequency response selected to emulate an inverse of a frequency response of the tilt compensation circuit 106. To that end, in some embodiments, the tilt equalizer circuit 304 may be pre-programmed and/or trained as described above for the tilt reference circuit 302, except that now the fitting would be performed for an inverse model to the tilt input-output data.

With reference to various signals 322-334 shown between different components of FIG. 3, the tilt reference circuit 302 is configured to generate a pre-tilted input signal 324 by applying, to an input signal 322, a frequency response selected to emulate a frequency response of the tilt compensation circuit 106. The pre-tilted input signal 324 may then be provided to the CFR circuit 202. The CFR circuit 202 is configured to generate a CFR output signal 326 by applying a peak reduction to the pre-tilted input signal 324. The CFR output signal 326 may then be provided to the tilt equalizer circuit 304. The tilt equalizer circuit 304 is configured to generate an equalized output signal 328 based on the CFR output signal 326, and the tilt compensation circuit 106 is configured to apply a tilt compensation to the equalized output signal 328 (or to a further modification of the equalized output signal 328, e.g., to an upconverted signal 330 generated by the upconverter 104 based on the equalized output signal 328) to generate a tilt-compensated signal 332. The tilt-compensated signal 332 may then be amplified by the PA circuit 108 to generate an amplified signal 334 for transmission through the cable, e.g., the cable 210.

Thus, otherwise incompatible CFR circuit 202 and cable tilt compensation circuit 106 can be used together, such as in a cable television or other cable communication system having a frequency-dependent signal loss at higher frequencies, by providing a tilt-adjusted CFR realized by a combination of the tilt reference circuit 302, the CFR circuit 202, and the tilt equalizer 304, as described herein. The input 324 to the CFR circuit 202 may be filtered by a digital model of the tilt, by means of the tilt reference circuit 302, while the output 326 of the CFR circuit 202 may be filtered by an inverse model of the tilt (i.e., an equalizer), by means of the tilt equalizer circuit 304. The tilt equalizer circuit 304 may have the effect of cancelling or removing the tilt and so eliminating the potential for peak regrowth. The tilt reference circuit 302 may restore the required tilt compensation. Without the tilt reference circuit 302, the tilt equalizer circuit 304 would cancel out the tilt compensation provided by the tilt compensation circuit 106. The combined effect of the tilt reference circuit 302 and the tilt equalizer circuit 304 may ensure that the signal-to-noise ratio (SNR) of the signal at the TX digital-to-analog conversion (DAC), which may, e.g., be a part of the upconverter 104, is preserved and not compromised.

In general, the CFR circuit 202 of the cable communication system 300 with tilt-adjusted CFR may be configured to implement any type of a peak reduction technique, e.g., any known in the art. Subsequent drawings will illustrate some variations of the cable communication system 300 with tilt-adjusted CFR.

Tilt-Adjusted CFR with Spectrally Shaped Peak Cancellation

Figure 4:
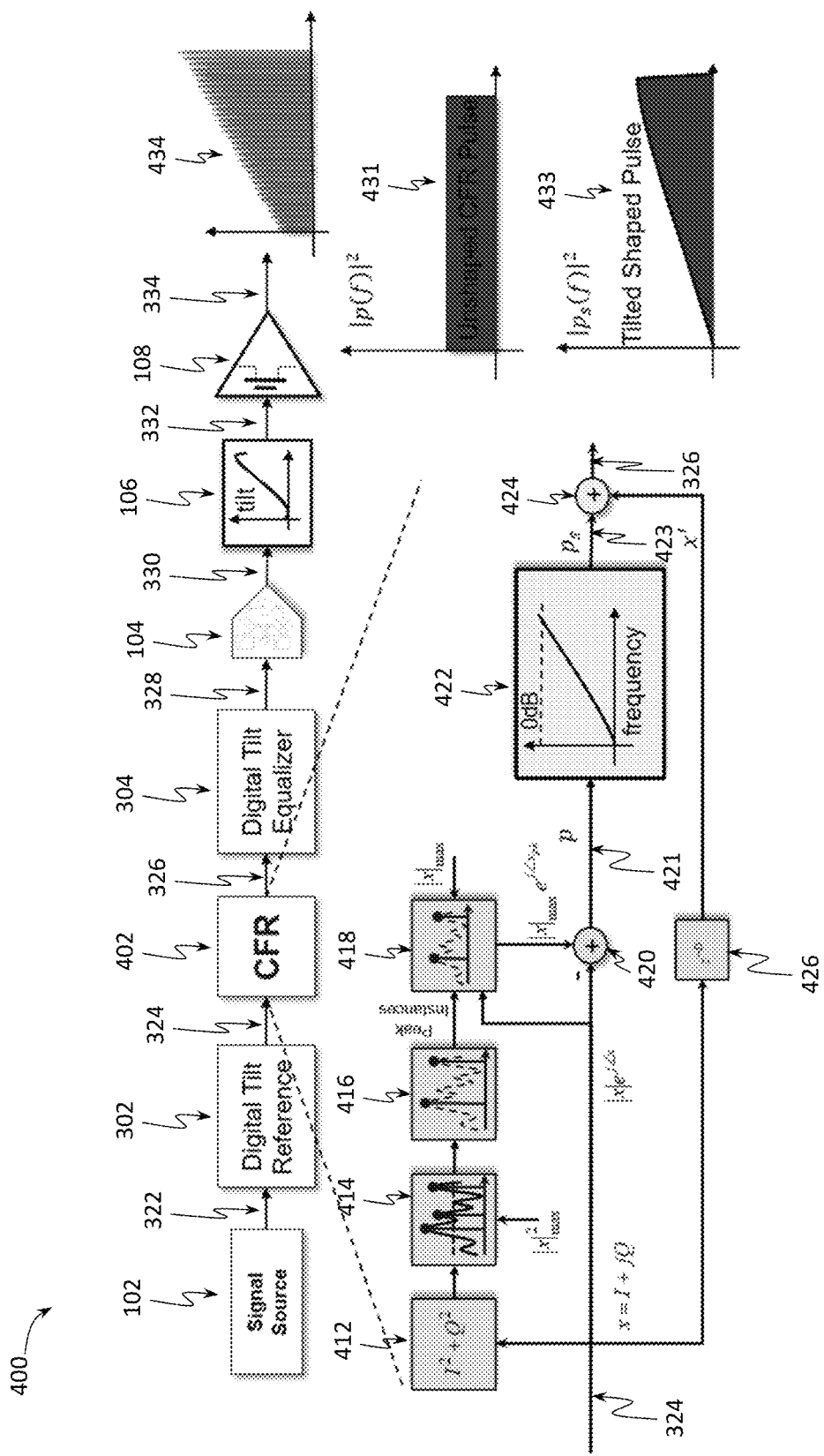
FIG. 4 illustrates a cable communication system with a tilt-adjusted CFR and a spectrally shaped cancellation pulse, according to some embodiments of the present disclosure.

In some embodiments, the CFR circuit 202 of the system 300 may be a peak cancellation CFR circuit, configured to use a cancellation pulse to reduce PAPR of a signal. An example of such embodiments is shown in FIG. 4, illustrating a cable communication system 400. The system of FIG. 4 is similar to the system 300 of FIG. 3 in that it also includes the signal source 102, the upconverter circuit 104, the tilt compensation circuit 106, the PA circuit 108, the tilt reference circuit 302, and the tilt equalizer circuit 304 as described above. A CFR circuit 402 shown in FIG. 4 may be seen as an example of the CFR circuit 202 of FIG. 2, where the CFR circuit 402 is a peak cancellation CFR circuit configured to implement a peak cancellation algorithm to reduce PAPR of a TX signal.

Peak cancellation is one type of possible CFR techniques to reduce the PAPR of a signal (other types include, e.g., peak windowing, or clipping and filtering). The CFR circuit 402 may be configured to achieve a certain acceptable balance between the OOB emission and in-band waveform quality when compressing a TX signal, e.g., the signal provided at the input to the CFR circuit 402, to a target PAPR. As shown in FIG. 4, the CFR circuit 402 may include an instantaneous power circuit 412 configured to compute an instantaneous power of a signal provided to the CFR circuit 402, e.g., of the output signal 324 generated by the tilt reference circuit 302. Next, based on the computed instantaneous power, a peak location circuit 414 of the CFR circuit 402 may be configured to identify all peaks in the instantaneous power signal. Next, a peak inhibitor circuit 416 of the CFR circuit 402 may removes peaks that are clustered together within a certain window and replace them by a single peak corresponding to the maximum peak over that window. A peak evaluator circuit 418 of the CFR circuit 402 may detect, from the output of the peak inhibitor circuit 416, those peaks above a defined threshold (e.g., a threshold at least partially determined by the target PAPR) and a complex value whose amplitude is set to the threshold and a phase corresponding to the corresponding phase of the original input. Together, the circuits 412, 414, 416 and 418 may generate a complex pulse at the instances of the amplitude peaks having the same phase as the input and an amplitude equal to prescribed upper limit. This pulse may have the same phase as the input signal 324, as deliberately changing the phase is not something these circuits are designed to do; it is only desirable to clip of limit the amplitude. A subtractor 420 of the CFR circuit 402 is then configured to generate a cancellation pulse 421 by subtracting the original complex input signal 324 from the limited peak output 419 from the peak evaluator circuit 418. Moreover, the CFR circuit 402 may include a spectral shaping circuit 422, configured to apply a frequency-dependent function to the cancellation pulse 421 to spectrally shape the cancellation pulse 421, generating a spectrally shaped cancellation pulse 423. In some embodiments, the spectral shaping implemented by the spectral shaping circuit 422 may include shaping the cancellation pulse 421 according to a function schematically illustrated in FIG. 4 within the spectral shaping circuit 422 (i.e., by a function that linearly increases from lower to higher frequencies). Graphs 431 and 433 shown on the right side of FIG. 4 illustrate, respectively, the unshaped cancellation pulse 421 and the spectrally shaped cancellation pulse 423. The spectrally shaped cancellation pulse 423 may have a tilted profile, in accordance with the function illustrated within the spectral shaping circuit 422 of FIG. 4, which may advantageously minimize CFR noise on channels with lower-frequency signals. Finally, the adder 424 of the CFR circuit 402 may be configured to subtract a scaled version of the cancellation pulses 423 from a time-aligned version of the original input 324 (time-aligned by the align circuit 426) so that the output 326 has a peak amplitude equal to the prescribed maximum level. In some embodiments, the time align circuit 426 may be implemented as a buffer, e.g., as a digital delay line. In some embodiments, the target PAPR may not be achieve d in one iteration, in which case the CFR circuit 402 may be configured to perform multiple iterations of this procedure, before finally generating the PAPR-reduced output signal 326. A graph 434, also shown in FIG. 4, illustrates that, as a result of applying the spectral shaping peak cancellation as described above, cable output spectrum at the PA circuit 108 (i.e., the PA output 334) may have a tilted profile.

Tilt-Adjusted CFR Combined with DPD

Figure 5:
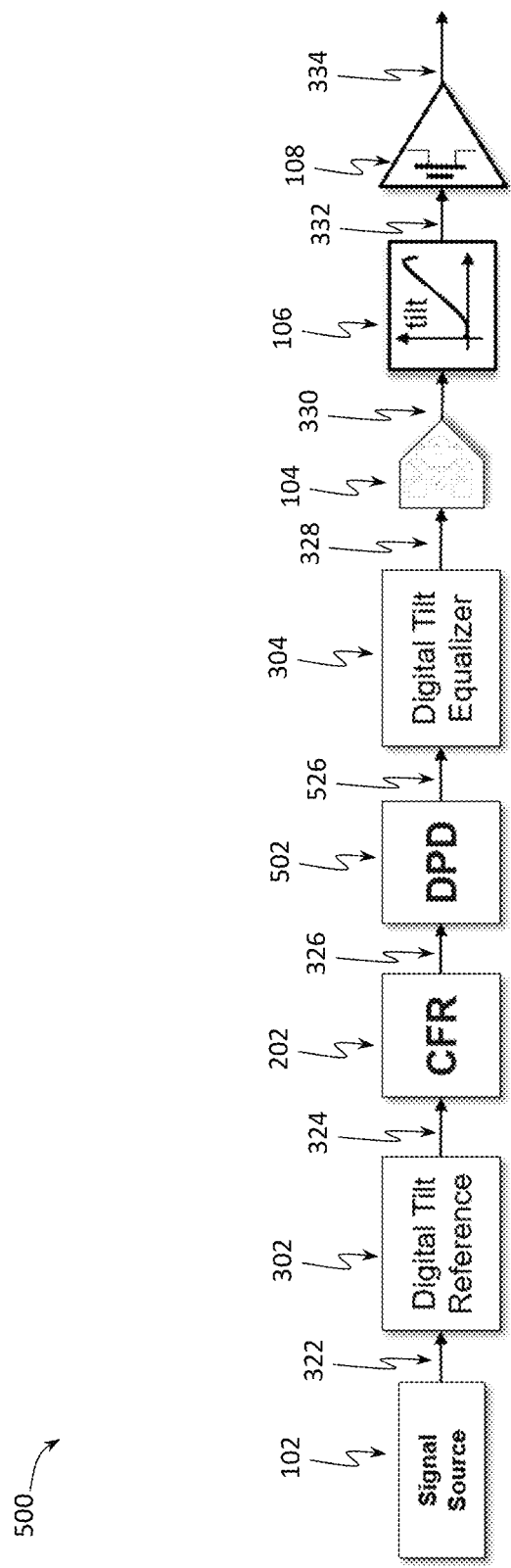
FIG. 5 illustrates a cable communication system with a tilt-adjusted CFR and digital predistortion (DPD), according to some embodiments of the present disclosure.

The present inventors further recognized that allowing a PA circuit to operate including in its nonlinear (e.g., gain compression) region can provide one or more benefits, such as to improve amplifier efficiency and performance, reduce power consumption, reduce waste heat generation, and reduce or avoid the need for active or passive cooling of the PA circuit, but that using the PA circuit with wideband input signals may present additional challenges that can increase distortion and noise in a PA circuit. To address at least some of these challenges, in some embodiments, a predistortion circuit can be placed in the signal path before the PA circuit 108 for compensating a gain compression of the PA circuit 108. For example, a DPD circuit 502 can be placed as shown in FIG. 5. A cable communication system 500 shown in FIG. 5 is similar to the system 300 of FIG. 3 in that it also includes the signal source 102, the upconverter circuit 104, the tilt compensation circuit 106, the PA circuit 108, the CFR circuit 202, the tilt reference circuit 302, and the tilt equalizer circuit 304 as described above. In addition, the system 500 further includes the DPD circuit 502 between the CFR circuit 202 and the tilt equalizer circuit 304. With reference to various signals 322-334 shown between different components of FIG. 5, what is different from the illustration of FIG. 3 is that the CFR output signal 326 may be provided to the DPD circuit 502. The DPD circuit 502 is configured to implement any of suitable DPD algorithms to pre-emptively correct, in the digital domain, for distortions due to the nonlinearity of the PA 108 (which, essentially, shapes the data before it gets to the PA 108 to counteract the nonlinearity distortions the PA 108 will produce). The DPD circuit 502 will apply any such DPD algorithms to the CFR output signal 326 to generate a digitally predistorted output signal 526, which digitally predistorted output signal 526 will then, eventually, be provided to the tilt compensation circuit 106. For example, in some embodiments, as shown in FIG. 5, the digitally predistorted output signal 526 may be provided to the tilt equalizer 304 which will process the digitally predistorted output signal 526 in substantially the same manner as described above for the CFR output signal 326, and produce the equalized output signal 328. The rest of the signal path may be substantially the same as described above with reference to FIG. 3.

Thus, in some embodiments, tilt-adjusted CFR may be combined with DPD, where CFR may help ensure that hard compression or clipping events are avoided, while DPD may correct for soft compression. In such a combination, the CFR input 324 may be shaped by the digital tilt reference circuit 302, and the DPD output 526 may be equalized by the tilt inverse model implemented by the digital tilt equalizer 304.

Since the nonlinear gain compression of the PA circuit 108 may vary over time and operating conditions, in some embodiments, a feedback loop can be used to monitor an output of the PA circuit 108. Such a feedback loop is not specifically shown in FIG. 5, but, if used, information monitored at the output of the PA circuit 108 could be fed back to the DPD circuit 502 to modify or vary the predistortion applied by the DPD circuit 502. For example, in some embodiments, an analog signal output of the PA circuit 108 (i.e., the PA output signal 334) can be fed back through a receive (RX) analog-to-digital converter (ADC) circuit (not shown in FIG. 5) to a DPD adaptation circuit (which could be a part of the DPD circuit 502) that can perform digital signal processing (DSP) and that can be coupled to DPD actuator circuit (which could also be a part of the DPD circuit 502) such as to control the predistortion applied by the DPD circuit 502.

Tilt-Adjusted CFR Combined with Dual-Path DPD

The present inventors also recognized that implementing DPD as a dual-path DPD may be particularly advantageous when combining DPD with tilt-adjusted CFR. Dual-path DPD is an approach where linear DPD operations are separated from nonlinear DPD operations, as, e.g., implemented by a DPD actuator. For example, the DPD actuator may be configured to perform a linear operation (which may, e.g., be a linear filter operation) and a nonlinear operation (which may, e.g., be a nonlinear filter operation). The linear operation may correct for linear effects in the DPD loop, e.g., similar to a pre-equalizer. The nonlinear operation may correct for nonlinear effects, e.g., distortion around the DPD loop due to nonlinear behavior of the PA circuit 108. A very simple example would be $y=a_1x+a_3x^3$, where the linear term is $a_1x$ and the nonlinear term is $a_3x^3$. Dual-path DPD splits the DPD algorithm into two paths—a linear path and a nonlinear path—in an attempt to reduce the signal processing costs (e.g., in terms of hardware and power consumption). The linear and the nonlinear paths may implement similar, or substantially the same DPD algorithms/actuators, except that the DPD is realized in two paths to reduce signal processing costs.

Figure 6A:
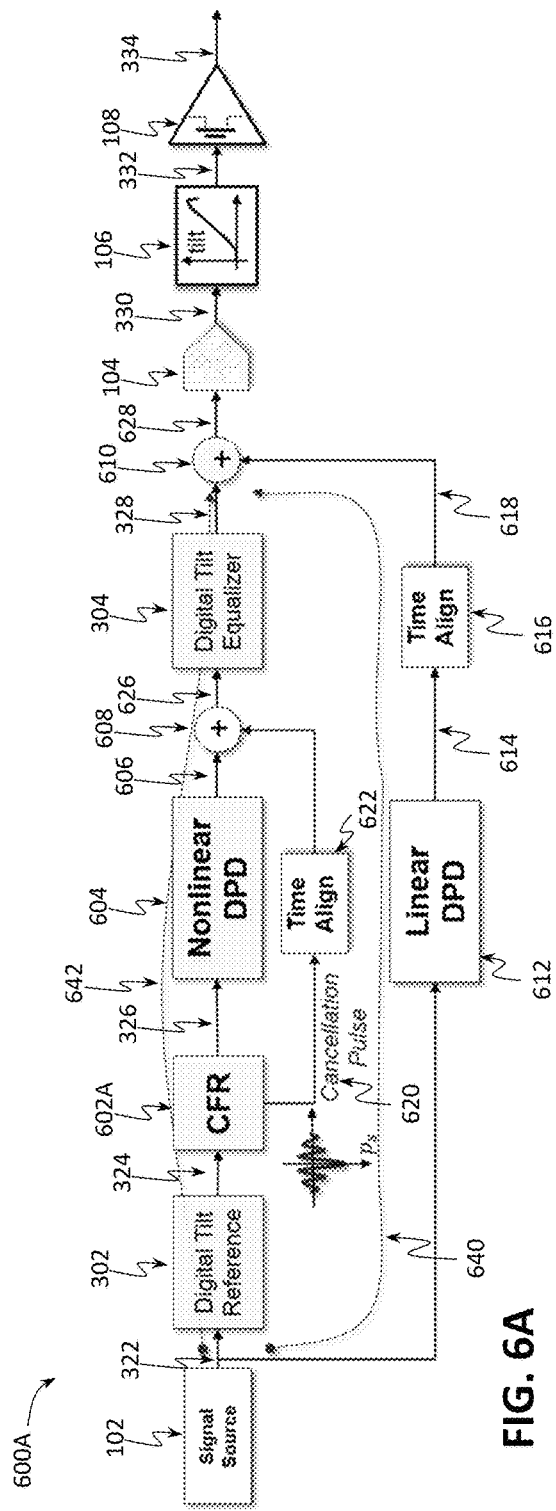
FIG. 6A illustrates a cable communication system with a tilt-adjusted CFR and a dual-path DPD with a cancellation pulse, according to some embodiments of the present disclosure.

Therefore, in some embodiments, a TX signal path can be separated into a linear path and a nonlinear path, with a respective DPD circuit used in each. An example of this is shown in FIG. 6A, illustrating a cable communication system 600A in which a signal path between the signal source 102 and the PA circuit 108 includes a linear path 640 and a nonlinear path 642. The cable communication system 600A shown in FIG. 6A is similar to the system 500 of FIG. 5 in that it also includes the signal source 102, the upconverter circuit 104, the tilt compensation circuit 106, the PA circuit 108, the tilt reference circuit 302, and the tilt equalizer circuit 304 as described above. In addition, the system 600A further includes, in the nonlinear path 642, a CFR circuit 602A and a nonlinear DPD circuit 604, where the CFR circuit 602A is between the digital tilt reference circuit 302 and the nonlinear DPD circuit 604, and the nonlinear DPD circuit 604 is between the CFR circuit 602A and the digital tilt equalizer 304. The CFR circuit 602A may be a peak cancellation CFR circuit, configured to use a cancellation pulse 620 (e.g., in combination with a time align circuit 426 and an adder 608) to reduce PAPR of a signal. In the linear path 640, the system 600A may further include a linear DPD circuit 612, and a time align circuit 616.

Thus, in some embodiments, the nonlinear path 642 of the cable communication system 600A may include, starting from the input signal 322 provided by the signal source 102, the digital tilt reference 302, the CFR circuit 602A, the nonlinear DPD circuit 604, the adder 608, and the digital tilt equalizer 304. The digital tilt reference circuit 302 may be configured to generate the pre-tilted input signal 324 by applying, to the input signal 322, a frequency response selected to emulate a frequency response of the tilt compensation circuit 106, as described above. The CFR circuit 602A may be configured to generate the CFR output signal 326 by applying a suitable peak reduction technique to a signal based on the input signal 322, e.g., to the pre-tilted input signal 324 generated by the digital tilt reference circuit 302. The nonlinear DPD circuit 604 may be configured to generate a nonlinearly predistorted output signal 606 by applying a nonlinear DPD to the CFR output signal 326.

Because the CFR circuit 602A may be a cancellation pulse CFR, it may generate a cancellation pulse 620, which, upon being time-aligned by the time align circuit 622, may be added, by the adder 608, to the nonlinearly predistorted output signal 606 generated by the nonlinear DPD circuit 604 to generate an input signal 626 to the digital tilt equalizer circuit 304. In other words, the CFR cancellation pulse 620 may be time-aligned, e.g., to account for the time delay through the nonlinear DPD circuit 604 so that the nonlinearly predistorted output signal 606 from the nonlinear DPD circuit 604 and the cancellation pulse 620 (now the output from the time align circuit 622) may be aligned. The time-aligned cancellation pulse 620 (i.e., the output from the time align circuit 622) may then be added to the nonlinearly predistorted output signal 606 to generate the signal 626 that is provided to the digital tilt equalizer circuit 304. In some embodiments, the time align circuit 622 may be implemented similar to the time align circuit 426, e.g., as a buffer, e.g., as a digital delay line.

In some embodiments, the adder 608 may be implemented as the adder 424 shown in FIG. 4, and the cancellation pulse 620 may be the cancellation pulse 423 shown in FIG. 4. Thus, in some embodiments, the cancellation pulse 620 that is added to the nonlinearly predistorted output signal 606 from the nonlinear DPD circuit 604 (after time alignment by the circuit 622) may be the spectrally shaped (tilted) CFR cancellation pulse as described with reference to FIG. 4.

The digital tilt equalizer circuit 304 may then be configured to generate the equalized output signal 328 based on the input provided thereto as described above, namely, based on the nonlinearly predistorted signal 626.

Turning to the linear path 640 of the cable communication system 600, in some embodiments, the linear path 640 may include, starting from the input signal 322 provided by the signal source 102, the linear DPD circuit 612 and the time align circuit 616. The linear DPD circuit 612 may be configured to generate a linearly predistorted output signal 614 by applying a linear DPD to the input signal 322. The time align circuit 616 may then perform time alignment of the linearly predistorted output signal 614 to generate a time-aligned linearly predistorted output signal 618, which may then be added, by the adder 610, with the output 328 of the digital tilt equalizer 304, to generate a dual-DPD equalized output signal 628 provided as an input to the upconverter 104. Thus, the time align circuit 616 aligns the nonlinear and linear DPD path outputs so that they can be added together by the adder 610. In various embodiments, the time align circuit 616 may be implemented as other time align circuits described above, e.g., as a digital delay line.

Once the dual-DPD equalized output signal 628 has been generated, the rest of signal processing in the TX signal path of the cable communication system 600A may be as described above. For example, the upconverter 104 may then perform digital-to-analog conversion and upconversion of the dual-DPD equalized output signal 628 to generate the upconverted signal 330, the tilt compensation circuit 106 is configured to apply tilt compensation to the upconverted signal 330 to generate the tilt-compensated signal 332, which may then be provided to the PA 108 for generating the PA output signal 334, as described above.

Implementing dual-path DPD, as e.g. shown in FIG. 6A, may allow minimizing hardware costs associated with various components related to DPD. In particular, the linear path 640 may be implemented so that at least some of the circuits in the linear path 640 are configured to perform processing at a lower rate, narrower bandwidth, possibly at complex baseband, with high resolution or SNR. On the other hand, at least some of the circuits in the nonlinear path 642 may be configured to perform processing at a higher rate, wider bandwidth, possibly at real RF, but lower resolution and lower SNR. Example shown in FIG. 6A is not the only one that may take advantage of such differences in processing conditions for linear and nonlinear paths, with FIG. 6B providing another example. A cable communication system 600B shown in FIG. 6B differs from that of FIG. 6A in that a different CFR circuit 602B is used. In particular, the CFR circuit 602B is based on yet another realization of the present inventors, namely, that, when dual-path DPD is implemented in a cable communication system, the CFR algorithm that implements relatively simple peak clipping may be sufficient. Thus, the CFR circuit 602B may be configured to simply clip peaks, of the input signal 324 provided thereto, having a magnitude with an absolute value above a certain threshold, which would be advantageous in terms of simpler architecture. In contrast to the embodiment of FIG. 6A, by implementing a simple peak clipping CFR circuit, a cancellation pulse is not used, also eliminating the need for the adder 608 and the time align circuit 622, described above. The rest of the descriptions provided with respect to FIG. 6A may be applicable to FIG. 6B and, therefore, in the interests of brevity, are not repeated.

Tilt-Adjusted CFR Combined with Dual-Path DPD with Complex Baseband to Real Conversion In some implementations, hardware costs may be reduced further by performing the processing of the nonlinear path of a dual-DPD on real RF signals, instead of complex baseband signals. FIGS. 7A and 7B illustrate, respectively, cable communication systems 700A and 700B.

The system 700A shown in FIG. 7A is similar to the system 600A shown in FIG. 6A, except that the nonlinear path 642 now further includes a complex baseband to real conversion circuit 702 and a real-to-complex baseband conversion circuit 704. In such an embodiment, the processing of the nonlinear path 642 is performed on the input signal 322 that has been converted, by the complex baseband to real conversion circuit 702, to a real input signal 722 (i.e., the digital tilt reference circuit 302 may be configured to generate the pre-tilted input signal 324 by applying, to the real input signal 722, a frequency response selected to emulate a frequency response of the tilt compensation circuit 106, as described above). The output 328 of the digital tilt equalizer 304 of the nonlinear path 642 is similarly converted back to complex baseband by the real-to-complex baseband conversion circuit 704 to generate a complex baseband nonlinear DPD path output signal 724, which is then added, by the adder 610, with the time-aligned linearly predistorted output signal 618, to generate the dual-DPD equalized output signal 628. The rest of the descriptions provided with respect to FIG. 6A may be applicable to FIG. 7A and, therefore, in the interests of brevity, are not repeated.

Figure 6B:
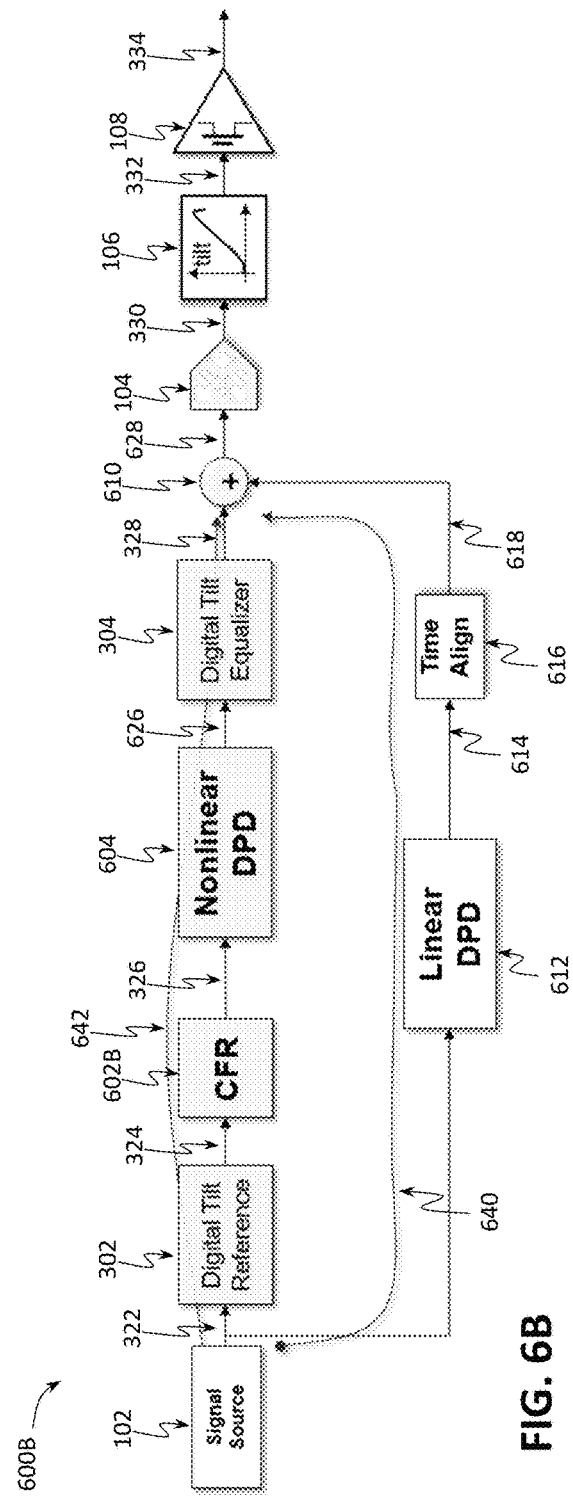
FIG. 6B illustrates a cable communication system with a tilt-adjusted CFR and a dual-path DPD without a cancellation pulse, according to some embodiments of the present disclosure.

The system 700B shown in FIG. 7B is similar to the system 600B shown in FIG. 6B, except that the nonlinear path 642 further includes the complex baseband to real conversion circuit 702 and the real-to-complex baseband conversion circuit 704 as described with reference to FIG. 7A. The embodiment of FIG. 7B differs from the embodiment of FIG. 7A in how the CFR circuit is implemented, which was described with reference to FIGS. 6A and 6B. The rest of the descriptions provided with respect to FIG. 6B may be applicable to FIG. 7B and, therefore, in the interests of brevity, are not repeated.

Example Data Processing System

Figure 8:
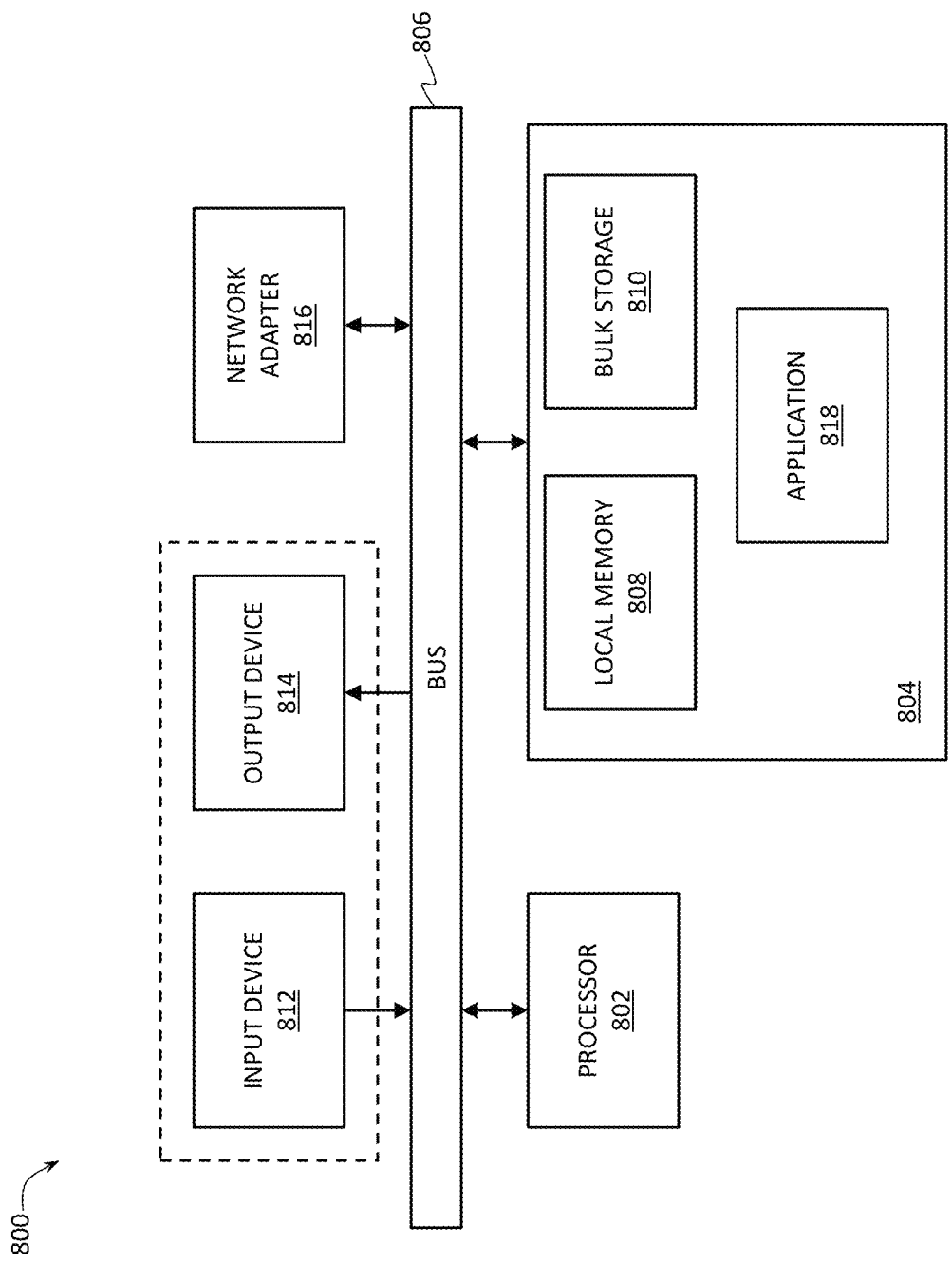
FIG. 8 provides a block diagram illustrating an example data processing system that may be configured to implement at least portions of a tilt-adjusted CFR, according to some embodiments of the present disclosure.

FIG. 8 provides a block diagram illustrating an example data processing system 800 that may be configured to implement at least portions of cable communication systems with tilt-adjusted CFR as described herein, e.g., of the cable communication systems as described with reference to FIGS. 3-7B, according to some embodiments of the present disclosure.

As shown in FIG. 8, the data processing system 800 may include at least one processor 802, e.g. a hardware processor 802, coupled to memory elements 804 through a system bus 806. As such, the data processing system may store program code within memory elements 804. Further, the processor 802 may execute the program code accessed from the memory elements 804 via a system bus 806. In one aspect, the data processing system may be implemented as a computer that is suitable for storing and/or executing program code. It should be appreciated, however, that the data processing system 800 may be implemented in the form of any system including a processor and a memory that is capable of performing the functions described within this disclosure.

In some embodiments, the processor 802 can execute software or an algorithm to perform the activities as discussed in this specification, in particular activities related to tilt-adjusted CFR, such as various techniques implemented by the CFR circuits described herein to limit peak excursions in a controlled manner prior to supplying TX signals to the PA circuit 108, various techniques implemented by the DPD circuits described herein, various techniques implemented by the tilt reference circuit 302 and/or the tilt equalizer circuit 304, and so on. The processor 802 may include any combination of hardware, software, or firmware providing programmable logic, including by way of non-limiting example a microprocessor, a DSP, a field-programmable gate array (FPGA), a programmable logic array (PLA), an integrated circuit (IC), an application specific IC (ASIC), or a virtual machine processor. The processor 802 may be communicatively coupled to the memory element 804, for example in a direct-memory access (DMA) configuration, so that the processor 802 may read from or write to the memory elements 804.

In general, the memory elements 804 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 800 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any of the circuits/components shown in FIGS. 3-7B, can also include suitable interfaces for receiving, transmitting, and/or otherwise communicating data or information in a network environment so that they can communicate with, e.g., the data processing system 800 of another one of these elements.

In certain example implementations, mechanisms for implementing tilt-adjusted CFR in cable communication systems as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 804 shown in FIG. 8, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 802 shown in FIG. 8, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 804 may include one or more physical memory devices such as, for example, local memory 808 and one or more bulk storage devices 810. The local memory may refer to RAM or other non-persistent memory device(s) generally used during actual execution of the program code. A bulk storage device may be implemented as a hard drive or other persistent data storage device. The processing system 800 may also include one or more cache memories (not shown) that provide temporary storage of at least some program code in order to reduce the number of times program code must be retrieved from the bulk storage device 810 during execution.

As shown in FIG. 8, the memory elements 804 may store an application 818. In various embodiments, the application 818 may be stored in the local memory 808, the one or more bulk storage devices 810, or apart from the local memory and the bulk storage devices. It should be appreciated that the data processing system 800 may further execute an operating system (not shown in FIG. 8) that can facilitate execution of the application 818. The application 818, being implemented in the form of executable program code, can be executed by the data processing system 800, e.g., by the processor 802. Responsive to executing the application, the data processing system 800 may be configured to perform one or more operations or method steps described herein.

Input/output (I/O) devices depicted as an input device 812 and an output device 814, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 814 may be any type of screen display, such as plasma display, liquid crystal display (LCD), organic light emitting diode (OLED) display, electroluminescent (EL) display, or any other indicator, such as a dial, barometer, or light emitting diode (LED). In some implementations, the system may include a driver (not shown) for the output device 814. Input and/or output devices 812, 814 may be coupled to the data processing system either directly or through intervening I/O controllers.

In an embodiment, the input and the output devices may be implemented as a combined input/output device (illustrated in FIG. 8 with a dashed line surrounding the input device 812 and the output device 814). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 816 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 800, and a data transmitter for transmitting data from the data processing system 800 to said systems, devices and/or networks. Modems, cable modems, and Ethernet cards are examples of different types of network adapter that may be used with the data processing system 800.

Example Method for Transmitting a Signal Over a Wired Connection

Figure 9:
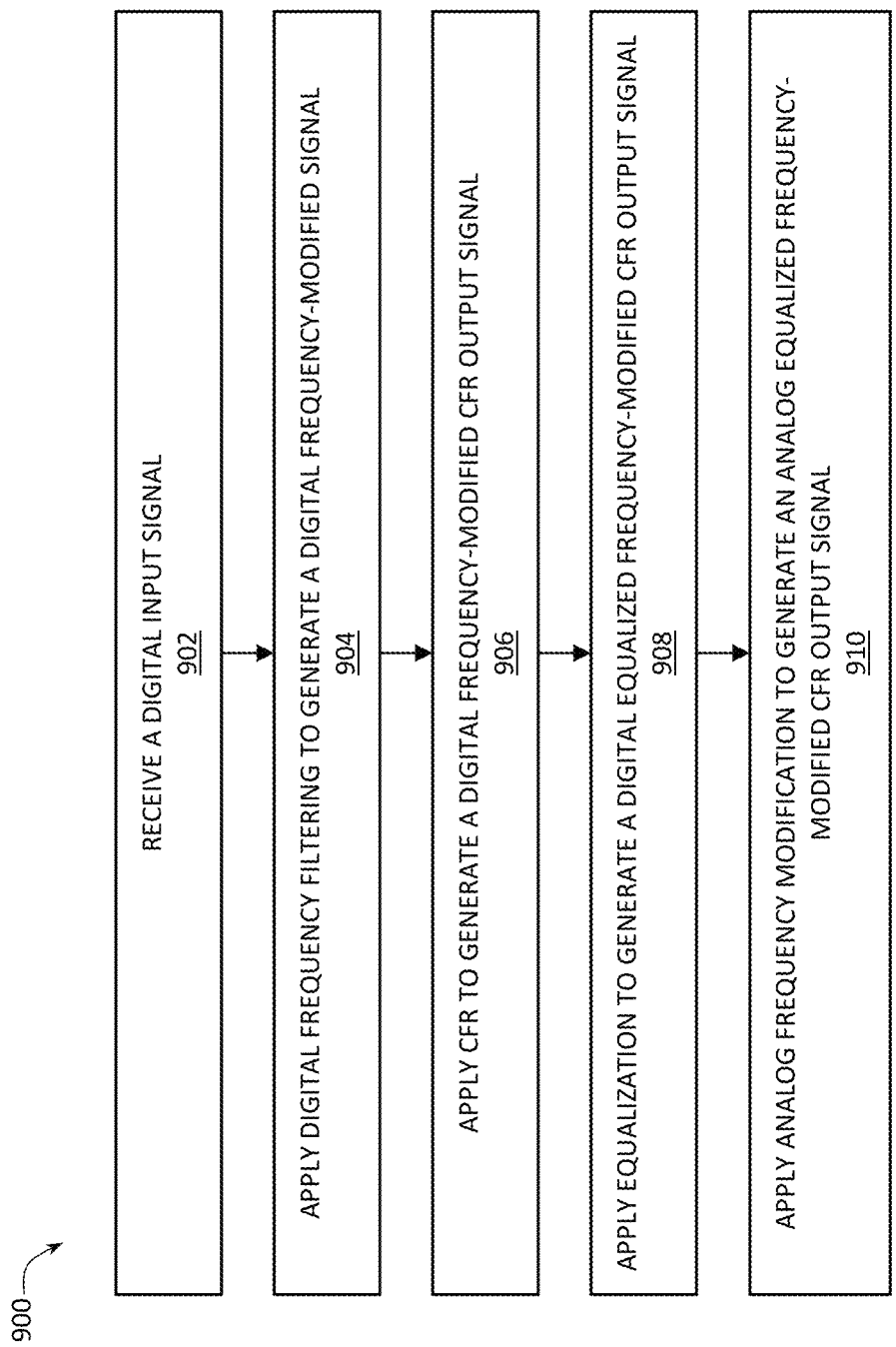
FIG. 9 provides a flow chart of a method for implementing a tilt-adjusted CFR to transmit a signal over a wired connection, according to some embodiments of the present disclosure.

FIG. 9 provides a flow chart of a method 900 for implementing a tilt-adjusted CFR to transmit a signal over a wired connection, according to some embodiments of the present disclosure. At least portions of the method 900 may be implemented by elements of a cable communication system according to any embodiments of the present disclosure, e.g., by the cable communication systems described with reference to FIGS. 3-7B, or/and by one or more data processing systems, such as the data processing system 800 shown in FIG. 8. Although described with reference to system components of the systems shown in the present figures, any system, configured to perform operations of the method 900, in any order, is within the scope of the present disclosure.

The method 900 may begin with receiving a digital input signal at 902. In some embodiments, 902 may include a signal source providing a digital signal as an input to the data processing system of a cable transmitter. For example, in some embodiments, 902 may include the signal source 102 providing the signal 322 as the digital input signal to whichever next component of the cable communication system is coupled to the output of the signal course 102 (e.g., to the digital tilt reference circuit 302).

At 904, the method 900 may include applying a digital frequency filtering to a signal indicative of the digital input signal received at 902, to generate a digital frequency-modified signal, where the digital frequency filtering is to emulate an analog frequency modification to be applied downstream (i.e., further down the signal path of the signal to be transmitted from the PA 108 over the wired connection). As used herein, an expression such as "a signal A indicative of a signal B" means that either signal A is the signal B, or that signal A is some processed version of signal B. For example, in some embodiments, 904 may include the digital tilt reference circuit 302 applying a digital frequency filtering to the digital input signal 322 received from the signal source 322, as shown in FIGS. 3-6B. On the other hand, in other embodiments, 904 may include the digital tilt reference circuit 302 applying a digital frequency filtering to the signal 722 which is a version of the digital input signal 322 the signal 322 has been converted from complex baseband to real signal by the complex baseband to real converter 702 as shown in FIGS. 7A-7B. In various embodiments, applying a digital frequency filtering at 904 may include applying a digital uptilt frequency filtering as described herein. For example, in some embodiments, applying a digital frequency filtering at 904 may include the digital tilt reference circuit 302 applying, to the digital input signal provided thereto, a frequency response selected to emulate a frequency response of the tilt compensation circuit 106, to generate a pre-tilted input signal, as described herein.

At 906, the method 900 may include applying a CFR to a signal based on the digital frequency-modified signal generated at 904, to generate a digital frequency-modified CFR output signal. For example, in some embodiments, 906 may include the CFR circuit 202 generate a CFR output signal by applying a peak reduction to the pre-tilted input signal, as described herein. More specifically, in some embodiments, 906 may include the CFR circuit 202, 402, 602A, or 602B applying a CFR to the digital frequency-modified signal 324 generated by the digital tilt reference circuit 302, to generate the digital frequency-modified CFR output signal 326, as described herein.

At 908, the method 900 may include applying an equalization to a signal based on the digital frequency-modified CFR output signal generated at 906 to compensate for the digital frequency filtering of 904, to generate a digital equalized frequency-modified CFR output signal. For example, in some embodiments, 908 may include the tilt equalizer circuit 304 performing equalization of the input signal provided thereto to generate an equalized output signal based on the CFR output signal 326. In some embodiments, 908 may include the tilt equalizer circuit 304 performing equalization on the signal 326 output by the CFR circuit 202 as shown in FIGS. 3-4. In other embodiments, 908 may include the tilt equalizer circuit 304 performing equalization on the signal 502 output by the DPD circuit 502 as shown in FIG. 5. In yet other embodiments, 908 may include the tilt equalizer circuit 304 performing equalization on the signal 626 that has undergone nonlinear DPD as shown in FIGS. 6A-6B and 7A-7B.

At 910, the method 900 may include applying an analog frequency modification to a signal based on the digital equalized frequency-modified CFR output signal generated at 908, to generate an analog equalized frequency-modified CFR output signal. For example, in some embodiments, 910 may include the tilt compensation circuit 106 generating a tilted input signal by applying a tilt compensation to the equalized signal provided to the tilt compensation circuit 106. In some embodiments, 910 may include the tilt compensation circuit 106 applying an analog frequency modification to the analog signal 330 may be based on the digital signal 328 output by the tilt equalizer circuit 304, converted to analog by the upconverter 104, as shown in FIGS. 3-5. In other embodiments, 910 may include the tilt compensation circuit 106 applying an analog frequency modification to the analog signal 330 may be based on the digital signal 628 generated as a result of combining nonlinear and linear DPD outputs, converted to analog by the upconverter 104, as shown in FIGS. 6A-6B and 7A-7B. Thus, in various embodiments, 910 may include performing a digital-to-analog conversion of a signal prior to applying the analog frequency modification.

Although not specifically shown in FIG. 9, in some embodiments, the method 900 may also include transmitting over the wired connection a signal based on the analog equalized frequency-modified CFR output signal generated at 910.

SELECT EXAMPLES

Example 1 provides a cable communication system configured to implement CFR with respect to an input signal. The system includes a linear path that includes a linear digital predistortion (DPD) circuit configured to generate a linearly predistorted output signal by applying a linear DPD to the input signal; a nonlinear path that includes a CFR circuit configured to generate a CFR output signal by applying a peak reduction to a signal based on the input signal, and further includes a nonlinear DPD circuit configured to generate a nonlinearly predistorted output signal by applying a nonlinear DPD to the CFR output signal; and a tilt compensation circuit configured to apply a tilt compensation to a signal including a combination of the linearly predistorted output signal and the nonlinearly predistorted output signal.

Example 2 provides the cable communication system according to example 1, where the nonlinear path further includes a digital tilt reference circuit and a digital tilt equalizer circuit, and where the digital tilt reference circuit is configured to generate a pre-tilted input signal by applying, to the input signal, a frequency response selected to emulate a frequency response of the tilt compensation circuit. Furthermore, the digital tilt equalizer circuit is configured to generate an equalized output signal based on the nonlinearly predistorted output signal, and the tilt compensation circuit applying the tilt compensation to the signal including a combination of the linearly predistorted output signal and the nonlinearly predistorted output signal includes the title compensation circuit applying the tilt compensation to a signal including a combination of the linearly predistorted output signal and the equalized output signal.

Example 3 provides the cable communication system according to example 2, where the digital tilt equalizer circuit generating the equalized output signal based on the nonlinearly predistorted output signal includes the digital tilt equalizer circuit generating the equalized output signal by applying, to a signal based on the nonlinearly predistorted output signal, a frequency response selected to be an inverse of the frequency response applied by the digital tilt reference circuit.

Example 4 provides the cable communication system according to any one of examples 1-3, where the CFR circuit applying the peak reduction includes the CFR circuit performing a peak clipping.

Example 5 provides the cable communication system according to any one of examples 1-3, where the CFR circuit applying the peak reduction includes the CFR circuit generating a cancellation pulse to be combined with the nonlinearly predistorted output signal.

Example 6 provides the cable communication system according to example 5, the cancellation pulse includes a cancellation pulse to which the CFR circuit applied a frequency-dependent function.

Example 7 provides the cable communication system according to any one of the preceding examples, where the nonlinear path further includes a complex-to-real converter at an input to the nonlinear path, and further includes a real-to-complex converter at an output of the nonlinear path so that, for the input signal in a complex domain received at the input to the nonlinear path, operations in the nonlinear path are performed on signals on a real domain, and a signal in the complex form is provided at the output of the nonlinear circuit.

Example 8 provides the cable communication system according to any one of the preceding examples, further including a PA configured to generate a PA output signal by amplifying a signal generated by the tilt compensation circuit.

Example 9 provides the cable communication system according to example 8, where the PA output signal is to be transmitted from the PA to a receiver over a wired connection (i.e., a cable).

Example 10 provides the cable communication system according to any one of the preceding examples, where the cable communication system is a cable television system.

Example 11 provides a cable communication system configured to reduce PAPR of an input signal to be transmitted over a wired connection (e.g., a cable), the system including a tilt reference circuit, e.g., a digital tilt reference circuit; a CFR circuit; a tilt equalizer circuit, e.g., a digital tilt equalizer circuit; and a tilt compensation circuit, e.g., an analog tilt compensation circuit. The tilt reference circuit is configured to generate a pre-tilted input signal by applying, to the input signal, a filter having a frequency response selected to emulate a frequency response of the tilt compensation circuit. The CFR circuit is configured to generate a CFR output signal by applying a peak reduction to the pre-tilted input signal. The tilt equalizer circuit is configured to generate an equalized output signal based on the CFR output signal. The tilt compensation circuit is configured to generate a tilted input signal by applying a tilt compensation to the equalized output signal.

Example 12 provides the cable communication system according to example 11, where a PA is configured to generate an amplified signal based on a signal indicative of the tilted input signal, and the amplified signal is to be transmitted over the wired connection to a receiver.

Example 13 provides the cable communication system according to examples 11 or 12, where the tilt equalizer circuit is configured to generate the equalized output signal by applying, to a signal indicative of the CFR output signal, a digital filter having a frequency response that is an inverse of the frequency response applied by the tilt compensation circuit or by the tilt reference circuit.

Example 14 provides the cable communication system according to any one of examples 11-13, where the CFR circuit applying the peak reduction includes the CFR circuit performing a peak clipping of the pre-tilted input signal.

Example 15 provides the cable communication system according to any one of examples 11-13, where the CFR circuit applying the peak reduction includes the CFR circuit applying a cancellation pulse based peak reduction algorithm.

Example 16 provides the cable communication system according to any one of examples 11-15, where each of the tilt reference circuit, the CFR circuit, and the tilt equalizer circuit is a digital circuit, and the tilt compensation circuit is an analog circuit.

Example 17 provides the cable communication system according to example 16, where the tilt reference circuit is a frequency-selective digital uptilt circuit having a high-pass frequency response selected to emulate a high-pass frequency response of the analog tilt compensation circuit.

Example 18 provides a method for reducing PAPR of signals to be transmitted over a wired connection (e.g., a cable). The method includes receiving a digital input signal; applying a digital frequency filtering to the digital input signal to produce a digital frequency-modified signal, where the digital frequency filtering is to emulate an analog frequency modification to be applied downstream; applying a CFR to a signal based on the digital frequency-modified signal to produce a digital CFR output signal; applying an equalization to the digital CFR output signal to compensate for the digital frequency filtering to produce a digital equalized signal; applying an analog frequency modification to a signal based on the digital equalized signal to produce an analog equalized frequency-modified CFR output signal; and transmitting over the wired connection a signal based on the analog equalized frequency-modified CFR output signal.

Example 19 provides the method according to example 18, further including performing a DAC on the digital equalized signal to produce the analog equalized frequency-modified CFR output signal; and applying the analog equalized frequency-modified CFR output signal to a PA to provide power amplification for transmitting the analog equalized frequency-modified CFR output signal over the wired connection.

Example 20 provides the method according to examples 18 or 19, where applying the digital frequency filtering includes applying a digital uptilt frequency filtering to the digital input signal, and applying the analog frequency modification includes applying an analog uptilt frequency filtering to produce the analog equalized frequency-modified CFR output signal.

Example 21 provides a non-transitory computer-readable storage medium including instructions for execution which, when executed by a processor, are operable to perform operations according to the method of any one of the preceding examples, or operations to enable functionality of the cable communication system according to any one of the preceding examples. Thus, in some examples, the non-transitory computer-readable storage medium according to example 21 may further include instructions operable to perform operations performed by any parts of the cable communication system in accordance with any one of the preceding examples.

Variations and Implementations

While embodiments of the present disclosure were described above with references to exemplary implementations as shown in FIGS. 3-8, a person skilled in the art will realize that the various teachings described above are applicable to a large variety of other implementations.

In certain contexts, the features discussed herein can be applicable to automotive systems, safety-critical industrial applications, medical systems, scientific instrumentation, wireless and wired communications, radio, radar, industrial process control, audio and video equipment, current sensing, instrumentation (which can be highly precise), and other digital-processing-based systems.

Moreover, certain embodiments discussed above can be provisioned in DSP technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind).

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions.

In the discussions of the embodiments above, components of a system, such as adders, buffers, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to tilt-adjusted CFR in cable communication systems.

Parts of various systems for implementing tilt-adjusted CFR in cable communication systems as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components of the cable communication systems shown in FIGS. 3-7, etc.) have only been offered for purposes of example and teaching only. Such information may be varied considerably without departing from the spirit of the present disclosure, or the scope of the appended claims. It should be appreciated that the system can be consolidated in any suitable manner. Along similar design alternatives, any of the illustrated circuits, components, modules, and elements of the present figures may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

It is also important to note that the functions related to operation of one or more cable communication systems implementing tilt-adjusted CFR as proposed herein illustrate only some of the possible functions that may be executed by, or within, cable communication systems. Some of these operations may be deleted or removed where appropriate, or these operations may be modified or changed considerably without departing from the scope of the present disclosure. Substantial flexibility is provided by embodiments described herein in that any suitable arrangements, chronologies, configurations, and timing mechanisms may be provided without departing from the teachings of the present disclosure.

The invention claimed is:

1. A cable communication system configured to transmit an input signal over a wired connection, the system comprising:
   a linear path that includes a linear digital predistortion (DPD) circuit configured to generate a linearly predistorted output signal by applying a linear DPD to the input signal;
   a nonlinear path that includes a crest factor reduction (CFR) circuit configured to generate a CFR output signal by applying a peak reduction to a signal based on the input signal, and further includes a nonlinear DPD circuit configured to generate a nonlinearly predistorted output signal by applying a nonlinear DPD to a signal based on the CFR output signal; and
   a tilt compensation circuit configured to apply a tilt compensation to a signal that includes a combination of the linearly predistorted output signal and the nonlinearly predistorted output signal.

2. The cable communication system according to claim 1, wherein:
   the nonlinear path further includes a digital tilt reference circuit and a digital tilt equalizer circuit,
   the digital tilt reference circuit is configured to generate a pre-tilted input signal by applying, to the input signal, a frequency response selected to emulate a frequency response of the tilt compensation circuit,
   the digital tilt equalizer circuit is configured to generate an equalized output signal based on the nonlinearly predistorted output signal, and
   the tilt compensation circuit applying the tilt compensation to the signal comprising a combination of the linearly predistorted output signal and the nonlinearly predistorted output signal includes the title compensation circuit applying the tilt compensation to a signal comprising a combination of the linearly predistorted output signal and the equalized output signal.

3. The cable communication system according to claim 2, wherein the digital tilt equalizer circuit generating the equalized output signal based on the nonlinearly predistorted output signal includes the digital tilt equalizer circuit generating the equalized output signal by applying, to a signal based on the nonlinearly predistorted output signal, a frequency response selected to be an inverse of the frequency response applied by the digital tilt reference circuit.

4. The cable communication system according to claim 1, wherein the CFR circuit applying the peak reduction includes the CFR circuit performing a peak clipping.

5. The cable communication system according to claim 1, wherein the CFR circuit applying the peak reduction includes the CFR circuit generating a cancellation pulse to be combined with the nonlinearly predistorted output signal.

6. The cable communication system according to claim 5, wherein the cancellation pulse includes a cancellation pulse to which the CFR circuit applied a frequency-dependent function.

7. The cable communication system according to claim 1, wherein the nonlinear path further includes a complex-to-real converter at an input to the nonlinear path, and further includes a real-to-complex converter at an output of the nonlinear path so that, for the input signal in a complex domain received at the input to the nonlinear path, operations in the nonlinear path are performed on signals on a real domain, and a signal in the complex form is provided at the output of the nonlinear circuit.

8. The cable communication system according to claim 1, further comprising a power amplifier (PA) configured to generate a PA output signal by amplifying a signal generated by the tilt compensation circuit.

9. The cable communication system according to claim 8, further comprising a transmitter for transmitting the PA output signal from the PA to a receiver over the wired connection.

10. The cable communication system according to claim 1, wherein the cable communication system is a cable television system.

11. A cable communication system configured to transmit an input signal over a wired connection, the system comprising:

a tilt reference circuit, configured to generate a pre-tilted input signal by applying, to the input signal, a frequency response that emulates a frequency response of a tilt compensation circuit;

a crest factor reduction (CFR) circuit, configured to:
generate a cancellation pulse by applying a cancellation pulse based peak reduction algorithm to the pre-tilted input signal, and
generate a CFR output signal by passing the cancellation pulse through a spectral shaping circuit configured to spectrally shape the cancellation pulse using a frequency-dependent function, the frequency-dependent function being a function that linearly increases from lower to higher frequencies; and a tilt equalizer circuit, configured to generate an equalized output signal based on the CFR output signal.

12. The cable communication system according to claim 11, wherein the tilt equalizer circuit is configured to generate the equalized output signal by applying, to a signal based on the CFR output signal, a filter having a frequency response that is an inverse of the frequency response of the tilt compensation circuit.

13. The cable communication system according to claim 11, wherein the tilt reference circuit is a frequency-selective uptilt circuit having a high-pass frequency response selected to emulate a high-pass frequency response of the tilt compensation circuit.

14. The cable communication system according to claim 11, wherein the cable communication system is a cable television system.

15. The cable communication system according to claim 11, further comprising the tilt compensation circuit, configured to generate a tilted input signal by applying a tilt compensation to a signal based on the equalized output signal.

16. The cable communication system according to claim 15, further comprising:
a power amplifier, configured to generate an amplified signal based on the tilted input signal.

17. The cable communication system according to claim 16, further comprising a transmitter, configured to transmit the amplified signal over the wired connection.

18. A method for transmitting a signal over a wired connection, the method comprising:
applying a frequency filtering to a signal based on an input signal to produce a frequency-modified signal;
applying a crest factor reduction (CFR) to a signal based on the frequency-modified signal to produce a frequency-modified CFR output signal, where applying the CFR includes:
generating a cancellation pulse by applying a cancellation pulse based peak reduction algorithm to the signal based on the frequency-modified signal, and
generating the frequency-modified CFR output signal by applying to the cancellation pulse a frequency-dependent function, the frequency-dependent function being a function that linearly increases from lower to higher frequencies;
applying an equalization to a signal based on the frequency modified CFR output signal to compensate for the frequency filtering to produce an equalized frequency-modified CFR output signal; and
transmitting over the wired connection a signal based on the equalized frequency-modified CFR output signal.

19. The method according to claim 18, further comprising:
performing a digital-to-analog conversion (DAC) on the signal based on the equalized frequency-modified CFR output signal to produce an analog frequency-modified CFR output signal; and
using a power amplifier to amplify the analog frequency-modified CFR output signal.

20. The method according to claim 18, wherein:
applying the frequency filtering includes applying a digital uptilt frequency filtering to the signal based on the input signal.

* * * * *